US008673731B2

(12) United States Patent
Chang et al.

(10) Patent No.: US 8,673,731 B2
(45) Date of Patent: Mar. 18, 2014

(54) TECHNIQUES FOR GATE WORKFUNCTION ENGINEERING TO REDUCE SHORT CHANNEL EFFECTS IN PLANAR CMOS DEVICES

(75) Inventors: Josephine B. Chang, Mahopac, NY (US); Isaac Lauer, Yorktown Heights, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/589,707

(22) Filed: Aug. 20, 2012

(65) Prior Publication Data

US 2014/0051225 A1    Feb. 20, 2014

(51) Int. Cl.
*H01L 27/092* (2006.01)

(52) U.S. Cl.
USPC ............ 438/404; 257/392; 257/E27.061; 257/E21.631; 257/347; 438/289

(58) Field of Classification Search
USPC ............. 257/392, E27.061, E21.631, 347; 438/289, 404
See application file for complete search history.

(56) References Cited

U.S. PATENT DOCUMENTS

| 6,444,512 | B1 | 9/2002 | Madhukar et al. |
| 7,807,525 | B2 | 10/2010 | Doris et al. |
| 7,879,669 | B1 | 2/2011 | Teng et al. |
| 2002/0074612 | A1 | 6/2002 | Bulucea et al. |
| 2002/0113288 | A1* | 8/2002 | Clevenger et al. ............ 257/513 |
| 2005/0051812 | A1 | 3/2005 | Dixit et al. |
| 2005/0098818 | A1* | 5/2005 | Feudel et al. ................. 257/310 |
| 2007/0052037 | A1* | 3/2007 | Luan .............................. 257/369 |
| 2007/0075351 | A1* | 4/2007 | Schulz et al. ................. 257/314 |
| 2007/0262451 | A1* | 11/2007 | Rachmady et al. ........... 257/758 |
| 2008/0093699 | A1 | 4/2008 | Abe et al. |
| 2009/0124057 | A1* | 5/2009 | Guha et al. .................... 438/301 |
| 2009/0230479 | A1* | 9/2009 | Hsu et al. ...................... 257/369 |
| 2009/0280631 | A1* | 11/2009 | Gambino et al. ............. 438/588 |
| 2010/0062579 | A1* | 3/2010 | Juengling et al. ............. 438/424 |
| 2011/0062546 | A1 | 3/2011 | Cheng et al. |

(Continued)

OTHER PUBLICATIONS

Title: proportional Visited date: Feb. 12, 2013 Publisher: Merriam-Webster (www.merriam-webster.com/dictionary/proportional) Pertinent Page: p. 1.*

(Continued)

*Primary Examiner* — Kevin Parendo
*Assistant Examiner* — Lamont Koo
(74) *Attorney, Agent, or Firm* — Louis J. Percello; Michael J. Chang, LLC

(57) ABSTRACT

Techniques for gate workfunction engineering using a workfunction setting material to reduce short channel effects in planar CMOS devices are provided. In one aspect, a method of fabricating a CMOS device includes the following steps. A SOI wafer is provided having a SOI layer over a BOX. A patterned dielectric is formed on the wafer having trenches therein present over active areas in which a gate stack will be formed. Into each of the trenches depositing: (i) a conformal gate dielectric (ii) a conformal gate metal layer and (iii) a conformal workfunction setting metal layer. A volume of the conformal gate metal layer and/or a volume of the conformal workfunction setting metal layer deposited into a given one of the trenches are/is proportional to a length of the gate stack being formed in the given trench. A CMOS device is also provided.

19 Claims, 3 Drawing Sheets

(56) References Cited

U.S. PATENT DOCUMENTS

| | | | |
|---|---|---|---|
| 2011/0079828 A1* | 4/2011 | Anderson et al. | 257/288 |
| 2011/0121404 A1* | 5/2011 | Shifren et al. | 257/392 |
| 2011/0298018 A1 | 12/2011 | Yin et al. | |
| 2012/0153401 A1* | 6/2012 | Javorka et al. | 257/392 |

OTHER PUBLICATIONS

K. Choi et al., "The effect of metal thickness, overlayer and high-k surface treatment on the effective work function of metal electrode," Proceedings of 35th European Solid-State Device Research Conference, ESSDERC 2005, Sep. 12-16, 2005, pp. 101-104.

I. Ferain et al., "Metal gate thickness optimization for MuGFET performance improvement," 38th European Solid-State Device Research Conference, 2008. ESSDERC, Sep. 15-19, 2008, pp. 202-205.

M. M. Hussain et al., "Gate-First Integration of Tunable Work Function Metal Gates of Different Thicknesses Into High-k/Metal Gates CMOS FinFETs for Multi-VTh Engineering," IEEE Transactions on Electron Devices, Mar. 2010, vol. 57, No. 3, pp. 626-631.

T.-H. Kim et al., "Utilizing Reverse Short-Channel Effect for Optimal Subthreshold Circuit Design," IEEE Transactions on Very Large Scale Integration (VLSI) Systems, Jul. 2007, vol. 15, No. 7, pp. 821-829.

P. Packan et al., "High performance 32nm logic technology featuring 2nd generation high-k + metal gate transistors," 2009 IEEE International Electron Devices Meeting (IEDM), Dec. 7-9, 2009.

* cited by examiner

TECHNIQUES FOR GATE WORKFUNCTION ENGINEERING TO REDUCE SHORT CHANNEL EFFECTS IN PLANAR CMOS DEVICES

FIELD OF THE INVENTION

The present invention relates to planar complementary metal-oxide semiconductor (CMOS) devices, and more particularly, to techniques for gate workfunction engineering using a workfunction setting material to reduce short channel effects in planar CMOS devices.

BACKGROUND OF THE INVENTION

In current CMOS scaling, the scaling of the physical channel length has not kept up with other scaling parameters. This issue has exacerbated several other scaling parameters, such as the distance between the metal contact and the gate.

A reverse short channel effect is a reduction in threshold voltage as the gate length increases. Namely, with CMOS devices, non-uniform channel doping is typically present where the source and drain regions of the device are more heavily doped (i.e., halo doping to reduce the depletion regions). As a result, in short channel length devices, the source and drain halo doping regions can overlap (also referred to as halo merging), thus increasing the overall channel dopant concentration as well as the threshold voltage. By comparison, in devices having a larger channel length, the source and drain halo doping are separated thus decreasing the overall channel dopant concentration as well as the threshold voltage.

To scale to shorter channel lengths, methods that enable adding a reverse short channel effect (such as occurs in planar bulk or partially depleted silicon-on-insulator (PDSOI) CMOS) would be highly beneficial.

SUMMARY OF THE INVENTION

The present invention provides techniques for gate workfunction engineering using a workfunction setting material to reduce short channel effects in planar CMOS devices. In one aspect of the invention, a method of fabricating a CMOS device is provided. The method includes the following steps. A semiconductor-on-insulator (SOI) wafer is provided having a SOI layer over a buried oxide (BOX). One or more active areas are formed in the SOI layer in which one or more field-effect transistor (FET) devices will be formed. A patterned dielectric is formed on the wafer having trenches therein present over the active areas in which a gate stack for each of the FET devices will be formed, wherein portions of the SOI layer are exposed at a bottom of each of the trenches. An interfacial oxide is formed on the portions of the SOI layer exposed at the bottom of each of the trenches. Into each of the trenches: (i) a conformal gate dielectric layer is deposited so as to line the trenches, (ii) a conformal gate metal layer is deposited on the conformal gate dielectric layer, and (iii) a conformal workfunction setting metal layer is deposited on the conformal gate metal layer to form gate stacks of the FET devices. A volume of the conformal gate metal layer and/or a volume of the conformal workfunction setting metal layer deposited into a given one of the trenches are/is proportional to a length of the gate stack being formed in the given trench.

In another aspect of the invention, a CMOS device is provided. The CMOS device includes a SOI wafer having a SOI layer over a BOX; one or more active areas formed in the SOI layer in which one or more FET devices are formed, each of the FET devices having an interfacial oxide on the SOI layer and a gate stack on the interfacial oxide layer, the gate stack having (i) a conformal gate dielectric layer present on a top and sides of the gate stack, (ii) a conformal gate metal layer lining the gate dielectric layer, and (iii) a conformal workfunction setting metal layer lining the conformal gate metal layer. A volume of the conformal gate metal layer and/or a volume of the conformal workfunction setting metal layer present in the gate stack are/is proportional to a length of the gate stack.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for the use of a work function setting material to reduce short channel effects in planar complementary metal-oxide semiconductor (CMOS) devices. An amount of the work function setting material employed will be continually modulated as a function of channel length. The present techniques may be applied to planar CMOS (bulk, partially depleted silicon-on-insulator (PDSOI), fully depleted SOI (FDSOI), and extremely thin SOI (ETSOI) devices).

The present techniques are applicable in both gate-first and gate-last process flows. In general, a gate-first approach to planar CMOS device fabrication involves formation of the gate early in the process, and use of the gate to position the source and drain doping. The dopant implantation and activation process (which involves annealing) can however damage the gate materials. Thus, more recently a gate-last approach has been investigated where a dummy gate is used in place of the traditional gate early in the process to place the source and drain dopants. The dummy gate is later removed and replaced with a replacement gate. This gate-last approach however involves more steps, thus increasing the processing complexity. Thus, there are benefits and drawbacks to both the gate-first and the gate-last process flows. Advantageously, the present techniques are easily integrated in either a gate-first or a gate-last approach where the gate is formed over a silicon wafer.

In the cases where channel doping is employed (for example in bulk planar CMOS devices), the present techniques are additive on top of the reverse short channel normally obtained from halo merging. In thin film, fully depleted SOI devices, this effect would be the only mechanism to introduce a reverse short channel effect.

Figure 1:
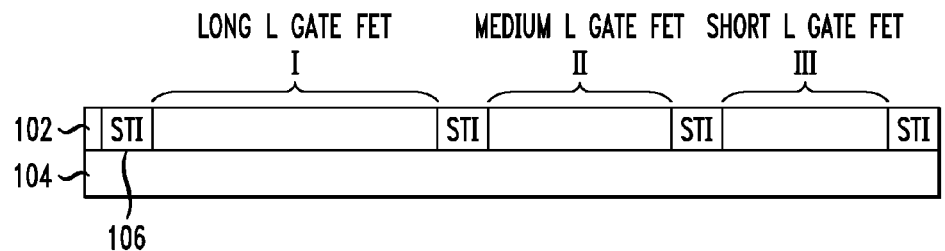
FIG. 1 is a cross-sectional diagram illustrating a starting structure for a planar complementary metal-oxide semiconductor (CMOS) device fabrication process, i.e., a semiconductor-on-insulator (SOI) wafer having an SOI layer over a buried oxide (BOX) according to an embodiment of the present invention.

The present process for fabricating a planar CMOS device will be illustrated by way of reference to FIGS. 1-7. FIG. 1 is a cross-sectional diagram illustrating a starting structure for the device fabrication process, namely a semiconductor-on-insulator (SOI) wafer having a SOI layer 102 over a buried oxide or BOX 104. A substrate (e.g., a silicon substrate) typically located beneath the BOX is not shown for ease of depiction. Suitable semiconductor materials for use in SOI layer 102 include, but are not limited to, silicon, germanium, silicon germanium, and silicon carbon.

A desired thickness of the SOI layer 102 can vary depending on the device(s) being fabricated on the wafer. By way of example only, when an extremely thin SOI device(s) is/are being formed, the SOI layer 102 preferably has a thickness of from about 3 nanometers (nm) to about 20 nm. By contrast, when bulk CMOS devices are being fabricated, the desired SOI layer thickness is greater, e.g., from about 30 nm to about 100 nm. In the exemplary embodiment being shown and described herein, multiple devices are being constructed on the same wafer. Thus, the desired SOI layer thickness can be selectively tailored depending on the area of the wafer a particular device(s) will be fabricated. Such a task would be within the capabilities of one of skill in the art. For instance, if both bulk and ETSOI devices are to be fabricated on the same wafer, then the starting wafer can be a commercial wafer or a wafer fabricated having an SOI layer thickness desired for a bulk device. The areas/regions of the wafer in which ETSOI devices will be fabricated can then be selectively thinned to the desired dimensions.

In the exemplary embodiment depicted, multiple devices will be fabricated on the starting wafer. For purposes of illustrating the present techniques, three devices will be produced, namely a long length (L) gate field effect transistor (FET), a medium length gate FET and a short length gate FET. Of course, this configuration of devices is merely exemplary and any other combination of devices, or even a single device, may be obtained using the present techniques. By way of example only, some exemplary long, medium and short gate lengths might be 60 nanometers (nm), 40 nm, and 30 nm, respectively. See also, FIG. 5, described below.

Accordingly, in the present example, three active areas are first formed in the SOI wafer using shallow trench isolation (STI) techniques. As is known in the art, STI involves patterning a plurality of trenches (which in this case extend through the SOI layer 102) and then filing the trenches with an insulator material, such as an oxide. These STI regions 106 thus formed will isolate distinct active areas of the wafer in which different devices will be fabricated. In this example, three active areas have been formed by STI, namely an active area I in which a long length gate FET will be fabricated, an active area II in which a medium length gate FET will be formed and an active area III in which a short length gate FET will be formed. See FIG. 1.

The active areas may be selectively doped (depending on the device being formed therein) by selectively doping the SOI layer in that region, e.g., with a p-type or an n-type dopant. By way of example only, if the device being produced is an n-channel FET, then it may be desirable to implant a p-type dopant into the SOI layer. Suitable p-type dopants include, but are not limited to, boron. Alternatively, when the device being produced is a p-channel FET, then it may be desirable to implant an n-type dopant into the SOI layer. Suitable n-type dopants include, but are not limited to, phosphorous and arsenic. While doping may be employed, e.g., in bulk planar FETs, doping would not be used in fully depleted SOI devices (i.e., the SOI layer would remain undoped).

Figure 2:
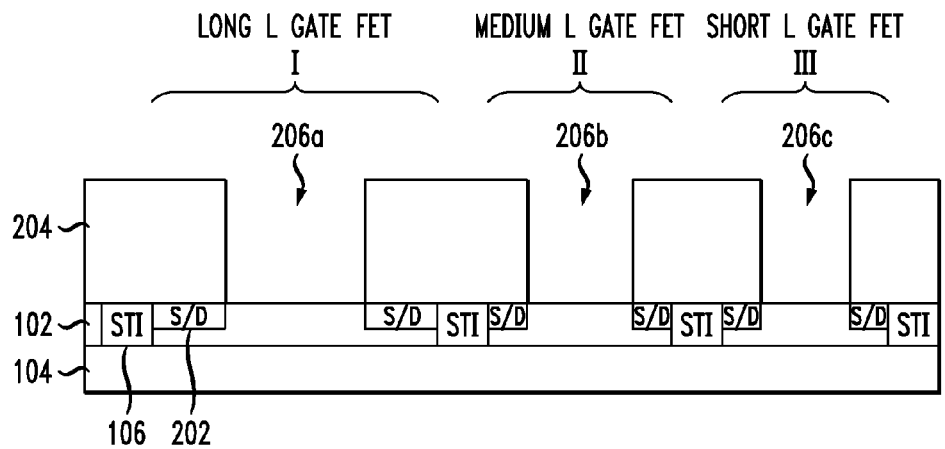
FIG. 2 is a cross-sectional diagram illustrating a dielectric material on the wafer with trenches patterned therein over active areas of the wafer according to an embodiment of the present invention.
Figure 3:
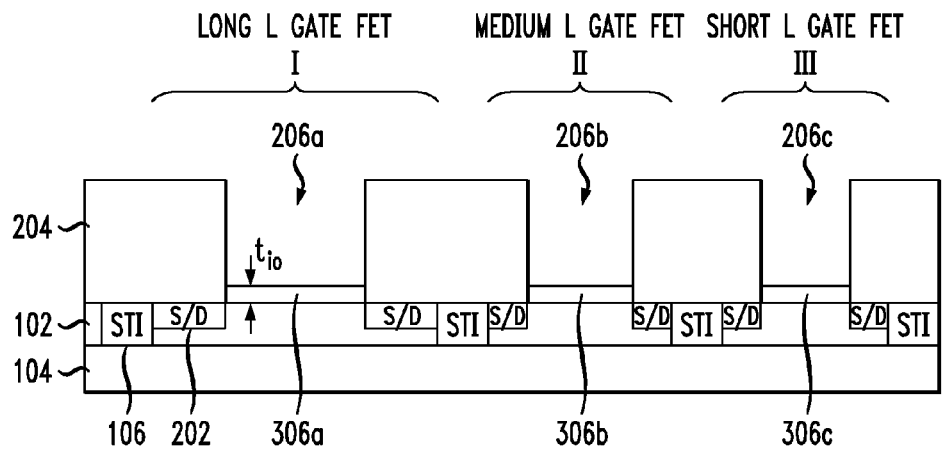
FIG. 3 is a cross-sectional diagram illustrating an interfacial oxide having been formed on the SOI layer in each of the trenches according to an embodiment of the present invention.
Figure 4:
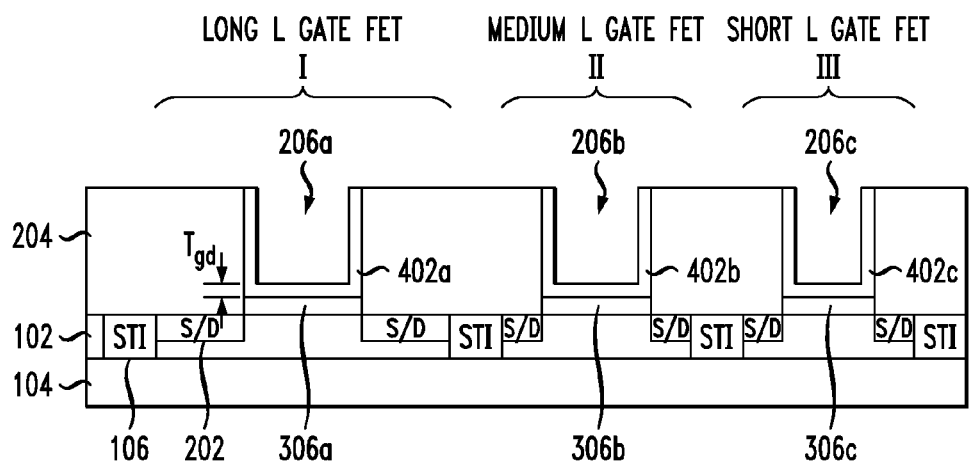
FIG. 4 is a cross-sectional diagram illustrating gate dielectric layers having been conformally deposited into the trenches on the interfacial oxide according to an embodiment of the present invention.

As described above, the present process is applicable both with a gate-first and a gate-last approach. In the case of a gate-last approach (also commonly referred to as a replacement gate flow), a dummy gate is employed to position the source/drain doping and then the dummy gate is removed and replaced with a replacement gate). Prior to removal of the dummy gate, a material, such as a planarizing dielectric, is deposited around the dummy gate. Suitable planarizing dielectric materials include, but are not limited to, a low-k dielectric material (such as LKD 1037 made by JSR Micro, Inc., Sunnyvale, Calif.). The dummy gate can be removed selective to the planarizing dielectric (using for example a wet etch such as diluted HF) leaving a trench in the planarizing dielectric over the active areas of the wafer (specifically, over what will be the channel region of each of the FET devices being formed). This is depicted in FIG. 2. As will be described in detail below, the trench can be filled with gate stack materials to form a replacement gate. The gate-last approach is described for example in P. Packan et al., "High performance 32 nm logic technology featuring $2^{nd}$ generation high-k+ metal gate transistors," 2009 IEEE International Electron Devices Meeting (IEDM), Dec. 7-9, 2009, the contents of which are incorporated by reference herein. The use of a dummy gate to place the source/drain dopants would be apparent to those of skill in the art and thus is not depicted in the present figures. What is notable here is that the source/drain doping may be performed at this stage in the process, or following formation of the gate, depending on which approach (gate-first or gate-last) is employed. The source/drain doping is represented schematically in FIG. 2 (and the figures thereafter) by boxes 202. With a gate-last approach, it is at the stage in the process where the dummy gate is removed but before the trench is filled with the replacement gate materials that the present description of the gate stack formation (see FIG. 3, described below) begins. Conversely, if a gate-first approach is being used, then according to an exemplary embodiment, the planarizing dielectric can be deposited onto the wafer and patterned (using standard lithography and etching techniques) to remove the planarizing dielectric from over the active areas of the wafer (specifically, from over what will be the channel region of each of the FET devices being formed). Either way, the result is a patterned planarizing dielectric 204 on the wafer (i.e., over the SOI layer 102) with trenches 206a, 206b and 206c in the planarizing dielectric over the active areas of the wafer (i.e., over what are to be the channel regions of the devices in active areas I, II and III, respectively). See FIG. 2. A portion of the SOI layer is exposed at the bottoms of the trenches.

The gate stack formation process then begins with formation of an interfacial oxide 306a, 306b and 306c in each of the trenches 206a, 206b and 206c, respectively. See FIG. 3. The interfacial oxide prepares the SOI layer 102 for the subsequent deposition of a high-k gate dielectric (see below). The interfacial oxide will form, for example, by exposing the wafer to an oxygen-containing environment. Further, advantageously, the interfacial oxide will form only on the exposed portions of the SOI layer 102 (i.e., at the bottoms of the trenches). According to an exemplary embodiment, the interfacial oxide is formed to a thickness $t_{io}$ (see FIG. 3) of from about 2 nm to about 10 nm.

Conformal gate dielectric layers 402a, 402b, and 402c are then deposited into (and lining) the trenches 206a, 206b and 206c on the interfacial oxide 306a, 306b and 306c, respectively. See FIG. 4. According to an exemplary embodiment, the gate dielectric layers are formed from a high-k dielectric material, such as hafnium oxide. Suitable conformal deposition processes include, but are not limited to chemical vapor deposition (CVD). By way of example only, the gate dielectric layers are each deposited to a thickness $t_{gd}$ (see FIG. 4) of from about 5 nm to about 20 nm. The amount of the materials used in the gate stack, e.g., gate dielectric thickness, the gate metal thickness (see below), etc. are ratioed to whatever gate lengths are used. According to the present techniques, the amounts of the gate stack materials are chosen where the workfunction setting metal is modulated by the gate length.

Figure 5:
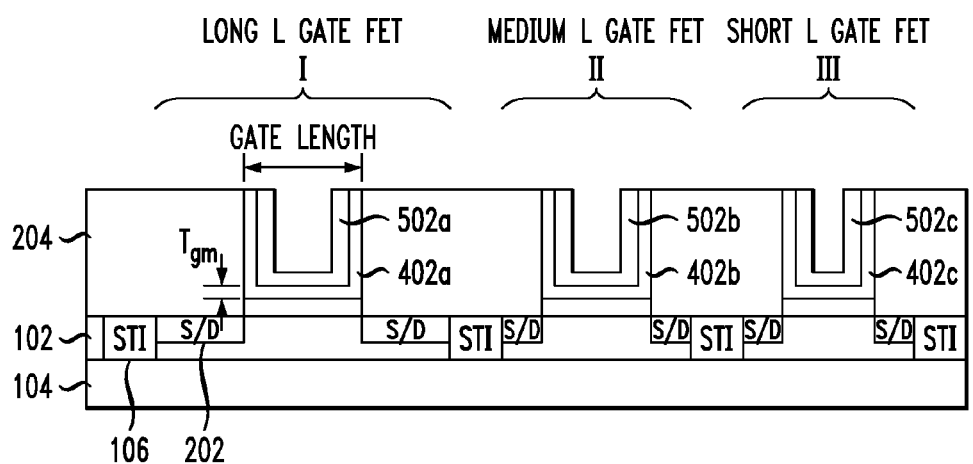
FIG. 5 is a cross-sectional diagram illustrating conformal gate metal layers having been deposited on the gate dielectric layers according to an embodiment of the present invention.

Next, as shown in FIG. 5, conformal gate metal layers 502a, 502b, and 502c are deposited on the gate dielectric layers 402a, 402b, and 402c, respectively. According to an exemplary embodiment, the gate metal layers include a metal(s) such as titanium and/or tantalum, e.g., titanium nitride and/or tantalum nitride. Suitable deposition processes for conformally depositing the gate metal (especially in the case of titanium and tantalum gate metals) include, but are not limited to CVD.

As will be described in detail below, a workfunction setting metal(s) will be deposited onto the gate metal. The workfunction setting metal acts as a doping source, and by way of the present process serves to change the workfunction of the gate stacks. Since the workfunction setting metal acts as a doping source, advantageously, the present process flow permits the same gate metal to be used in each of the devices being formed (which simplifies the fabrication process). A different workfunction setting metal can then be employed depending, e.g., on whether an n-channel FET (NFET) or a p-channel FET (PFET) is desired. Further, the metal from the gate stack will diffuse into the surrounding dielectric to change the threshold voltage of the device. Specifically, the more metal present in the gate, the lower the threshold voltage ($V_T$) of the device. Thus, by adding a workfunction setting metal to the gate stack, the threshold voltages of the resulting devices can be lowered. The amount of workfunction setting metal needed, however, is proportional to the gate length of the device being formed. For instance, if devices of varying gate length are being fabricated on the same wafer, but the same volume of workfunction setting metal was used for each of the devices, then some of the devices might receive too little metal and thus exhibit threshold voltages that are too high (assuming threshold voltages within a given range are desirable). Advantageously, with the present techniques, the volume of workfunction setting metal is proportional to the gate length. This is why three devices of varying gate length are shown in the figures so as to illustrate this aspect of the present techniques.

Figure 6:
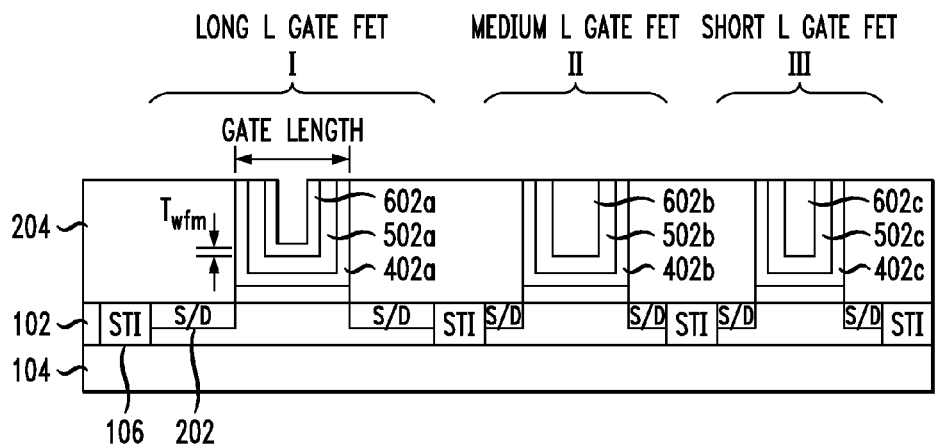
FIG. 6 is a cross-sectional diagram illustrating conformal workfunction setting metal layers having been deposited on the gate metal layers according to an embodiment of the present invention.

Accordingly, the volume of the gate metal layers and the volume of the workfunction setting metal (to be deposited as described below) are important parameters to the present process. According to the present techniques, the volume of these metal layers is quantified based on the thickness of these layers. By way of example only, as shown in FIG. 5, the gate metal layers are deposited to a thickness $T_{gm}$ of (i.e., a uniform thickness across all of the devices) from about 5 nm to about 20 nm. As shown in FIG. 5, due to the configuration of the gate stack, this will result in a greater volume of gate metal being deposited in the long length gate FET versus the medium length gate FET, and a greater volume of gate metal being deposited in the medium length gate FET versus the short length gate FET. The gate length dimension, as referred to herein, is shown illustrated in FIG. 5. The amount of the materials used in the gate stack, e.g., gate dielectric thickness, the gate metal thickness, etc. are ratioed to whatever gate lengths are used. According to the present techniques, the amounts of the gate stack materials are chosen where the workfunction setting metal is modulated by the gate length Next, as shown in FIG. 6, conformal workfunction setting metal layers 602a, 602b, and 602c are deposited on the gate metal layers 502a, 502b, and 502c, respectively. As provided above, the workfunction setting metal acts as a doping source, and a different workfunction setting metal can then be employed depending on whether a NFET or a PFET device is desired. Thus, the same gate metal (e.g., titanium nitride or tantalum nitride) can be used in each of the devices, yet a different (if so desired) workfunction setting metal can be used in one or more devices to obtain a different doping polarity. By way of example only, suitable workfunction setting metals for use in PFET devices include, but are not limited to aluminum, dysprosium, gadolinium, and ytterbium. Suitable workfunction setting metals for use in NFET devices include, but are not limited to lanthanum, titanium, and tantalum. Suitable deposition processes for conformally depositing the workfunction setting metal(s) include, but are not limited to CVD. Conventional CVD processes can be used to selectively deposit a given workfunction setting metal for a given device stack on the wafer.

As also described above, the workfunction metal serves to lower the threshold voltage ($V_T$) of the device. The amount of workfunction setting metal needed, however, is proportional to the gate length of the device being formed. Advantageously, by way of the present process, the workfunction setting metal(s) can be deposited to a given thickness ($T_{wsm}$, see FIG. 6) throughout the devices (e.g., to a thickness of from about 5 nm to about 20 nm), but because of the configuration of the gate stacks, the volume of workfunction setting metal present in each gate stack will be proportional to gate length. Namely, the present techniques rely on using the gate length variation to intentionally vary the amount (volume) of the workfunction metal. Therefore, the amount (volume) of workfunction metal is varied by having a different size gap for the workfunction setting metal to fill in as a function of gate length. See for example in FIG. 6 where it is shown that a greater volume of workfunction setting metal is present in the long length gate FET versus the medium length gate FET, and a greater volume of workfunction setting metal is present in the medium length gate FET versus the short length gate FET. It is notable that in the example shown in FIG. 6, the workfunction setting metal layers 602a, 602b, and 602c deposited to a thickness $T_{wfm}$ will result in the workfunction metal layers 602b and 602c completely filling the trenches 206b and 206c, respectively.

If so desired, it is not necessary to vary the composition of the workfunction setting metal used in the devices, and embodiments are anticipated herein where the same workfunction setting metal (deposited, e.g., to the same thickness) is used in each of the workfunction setting metal layers 602a, 602b, and 602c.

Figure 7:
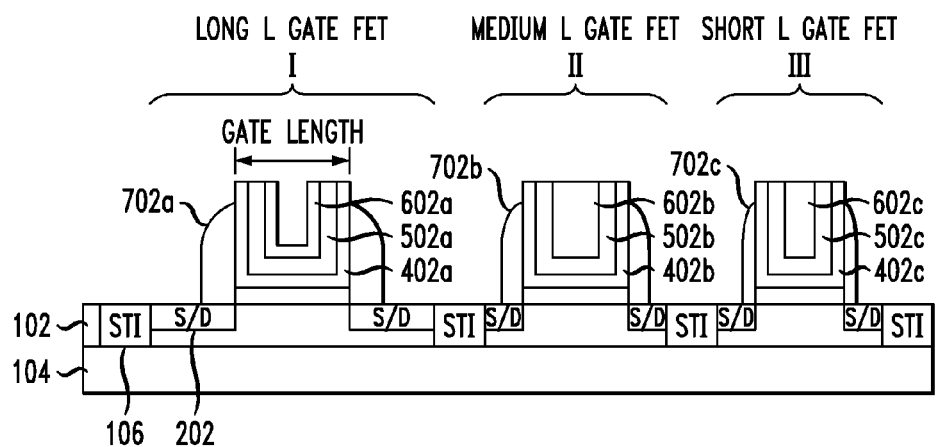
FIG. 7 is a cross-sectional diagram illustrating the dielectric material having been removed selective to the gate stacks according to an embodiment of the present invention.

Next, as shown in FIG. 7, following deposition of the workfunction setting metal layers (602a-c), the dielectric surrounding the gate stacks can be removed. By way of example only, the dielectric 302 can be removed selective to the gate stacks using a dilute hydrofluoric wet chemical etch. As also shown in FIG. 7, spacers 702a/702b/702c can be formed on opposite sides of the gate stacks. According to an exemplary embodiment, the spacers are formed from a nitride material (e.g., silicon nitride), wherein the nitride material is blanket deposited onto the wafer and then patterned (using conventional lithography processes) into spacers 702a/702b/702c. Any further standard processing steps may also be performed, if so desired, to the device structure.

As shown in FIG. 7, as a result of the present process, the resulting gate stacks have a unique configuration. Namely, each of the gate stacks includes a gate dielectric that is present on the bottom and sides of each stack. The interfacial oxide layers separate the gate dielectric from the SOI layer. The gate dielectric thus takes on the u-shaped configuration from the dimensions of the trench (see description of the deposition process, above). The gate metal and potentially the workfunction setting metal layers then conformally line the gate dielectric. It is notable that with the shorter gate length devices, the workfunction setting metal fills the center portion of the gate stack. See FIG. 7.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a complementary metal-oxide semiconductor (CMOS) device, comprising the steps of:
    providing a semiconductor-on-insulator (SOI) wafer comprising a SOI layer over a buried oxide (BOX);
    forming active areas in the SOI layer in which field-effect transistor (FET) devices will be formed;
    forming a patterned dielectric on the wafer having trenches therein present over the active areas in which gate stacks for the FET devices will be formed, wherein at least a first given one of the gate stacks having at least one first length and corresponding to at least a first given one of the FET devices will be formed in at least a first given one of the trenches and at least a second given one of the gate stacks having at least one second length and corresponding to at least a second given one of the FET devices will be formed in at least a second given one of the trenches, and wherein portions of the SOI layer are exposed at a bottom of each of the trenches;
    forming an interfacial oxide on the portions of the SOI layer exposed at the bottom of each of the trenches; and
    into each of the trenches, (i) depositing a conformal gate dielectric layer so as to line the trenches, wherein the conformal gate dielectric layer deposited into each of the trenches comprises a high-k dielectric material (ii) depositing a conformal gate metal layer on the conformal gate dielectric layer, and (iii) depositing a conformal workfunction setting metal layer, that is configured to act as a doping source to change a workfunction of the gate stacks, on the conformal gate metal layer to form the gate stacks of the FET devices,
    wherein one or more of an amount of the conformal gate metal layer and an amount of the conformal workfunction setting metal layer deposited into a given one of the trenches varies proportionally to a length of the gate stacks since the trenches provide, based on the length of the gate stacks, different size gaps for the conformal gate metal layer and the conformal workfunction setting metal layer to fill in, and wherein variations in the amount of the conformal workfunction setting metal layer in the gate stacks alters a threshold voltage of the FET devices, and thus by having the gate stacks with the at least one first length and the at least one second length the amount of the conformal workfunction setting metal layer is varied by having the different size gaps for the conformal workfunction setting metal layer to fill in as a function of the length of the gate stacks so as to configure the at least a first given one of the FET devices to have a threshold voltage that is different from a threshold voltage of the at least a second given one of the FET devices.

2. The method of claim 1, wherein the SOI layer comprises a semiconductor material selected from the group consisting of: silicon, germanium, silicon germanium, and silicon carbon.

3. The method of claim 1, wherein the active areas are formed in the wafer using shallow trench isolation (STI).

4. The method of claim 1, further comprising the step of:
    selectively doping at least one of the active areas formed in the SOI layer with a p-type or an n-type dopant.

5. The method of claim 1, wherein at least one of the active areas formed in the SOI layer is undoped.

6. The method of claim 1, wherein the patterned dielectric comprises a low-k dielectric material.

7. The method of claim 1, wherein the step of forming the patterned dielectric on the wafer having the trenches therein present over the active areas, comprises the steps of:
    depositing a dielectric material onto the wafer; and
    patterning the trenches in the dielectric material over the active areas of the wafer.

8. The method of claim 1, wherein the trenches present in the patterned dielectric over the active areas of the wafer are formed by removal of a dummy gate.

9. The method of claim 1, wherein the interfacial oxide is formed to a thickness of from about 2 nm to about 10 nm.

10. The method of claim 1, wherein the high-k dielectric material comprises hafnium oxide.

11. The method of claim 1, wherein the conformal gate dielectric layer is deposited into each of the trenches using chemical vapor deposition.

12. The method of claim 1, wherein the conformal gate dielectric layer is deposited into each of the trenches to a thickness of from about 5 nm to about 20 nm.

13. The method of claim 1, wherein the conformal gate metal layer deposited into each of the trenches comprises one or more of titanium nitride and tantalum nitride.

14. The method of claim 1, wherein the conformal gate metal layer is deposited into each of the trenches to a thickness of from about 5 nm to about 20 nm.

15. The method of claim 1, wherein the conformal workfunction setting metal layer deposited into at least one of the trenches comprises a metal selected from the group consisting of aluminum, dysprosium, gadolinium, and ytterbium.

16. The method of claim 1, wherein the conformal workfunction setting metal layer deposited into at least one of the trenches comprises a metal selected from the group consisting of lanthanum, titanium, and tantalum.

17. The method of claim 1, wherein the conformal workfunction setting metal layer is deposited into each of the trenches to a thickness of from about 5 nm to about 20 nm.

18. The method of claim 1, further comprising the step of:
    removing the patterned dielectric selective to the gate stacks.

19. The method of claim 1, further comprising the step of:
    forming spacers on opposite sides of the gate stacks.

* * * * *